United States Patent
Ivanov et al.

(10) Patent No.: US 9,176,203 B2
(45) Date of Patent: Nov. 3, 2015

(54) APPARATUS AND METHOD FOR IN SITU CURRENT MEASUREMENT IN A CONDUCTOR

(71) Applicants: Texas Instruments Incorporated, Dallas, TX (US); TEXAS INSTRUMENTS DEUTSCHLAND GMBH, Freising (DE)

(72) Inventors: Mikhail Valeryevich Ivanov, Freising (DE); Siva RaghuRam Prasad Chennupati, Unterschleissheim (DE); Viola Schaffer, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 118 days.

(21) Appl. No.: 13/838,576

(22) Filed: Mar. 15, 2013

(65) Prior Publication Data
US 2014/0218018 A1    Aug. 7, 2014

Related U.S. Application Data

(60) Provisional application No. 61/760,820, filed on Feb. 5, 2013.

(51) Int. Cl.
*G01R 33/02* (2006.01)
*G01R 33/09* (2006.01)
*G01R 15/14* (2006.01)
*G01R 15/20* (2006.01)

(52) U.S. Cl.
CPC .............. *G01R 33/02* (2013.01); *G01R 15/148* (2013.01); *G01R 15/207* (2013.01); *G01R 33/09* (2013.01)

(58) Field of Classification Search
CPC ........ G01R 33/02; G01R 33/00; G01R 33/09; G01R 15/148; G01R 15/207; G01R 19/00; G01R 15/14; G01R 15/20
USPC .......... 324/117 R, 117 H, 127, 177, 348, 522, 324/713, 754.26, 244, 247, 252
See application file for complete search history.

(56) References Cited

U.S. PATENT DOCUMENTS

| | | | |
|---|---|---|---|
| 3,571,700 A | | 3/1971 | Paine et al. |
| 4,823,075 A | * | 4/1989 | Alley ........................ 324/117 H |

(Continued)

FOREIGN PATENT DOCUMENTS

EA    8209    4/2007

OTHER PUBLICATIONS

Bazzocchi, et al. "Interference rejection algorithm for current measurement using magnetic sensor arrays", Sensors and Actuators 85 (2000), pp. 38-41.

(Continued)

*Primary Examiner* — Son Le
(74) *Attorney, Agent, or Firm* — Tuenlap D. Chan; Frank D. Cimino (57) ABSTRACT

Improved current sensing methods and apparatus and conductor apparatus are presented for sensing current in a bus bar or other conductor using one or more circular magnetic sensors or multiple magnetic sensors disposed on a substrate in a pattern surrounding a longitudinal path within the outer periphery of the conductor to avoid or mitigate sensed magnetic field crosstalk and to facilitate use of high sensitivity magnetic sensors at locations inside the conductor periphery in which the magnetic field is relatively small.

16 Claims, 7 Drawing Sheets

(56) References Cited

U.S. PATENT DOCUMENTS

| | | | |
|---|---|---|---|
| 5,942,895 A * | 8/1999 | Popovic et al. | 324/251 |
| 6,278,272 B1 | 8/2001 | Scarzello et al. | |
| 6,731,105 B1 | 5/2004 | Hoyle et al. | |
| 7,298,141 B2 | 11/2007 | Bartington | |
| 7,391,210 B2 | 6/2008 | Zhang et al. | |
| 7,391,211 B2 | 6/2008 | Cripe | |
| 7,834,620 B2 | 11/2010 | Kejik et al. | |
| 8,339,133 B2 | 12/2012 | Teppan | |
| 2004/0232913 A1 | 11/2004 | Schott et al. | |
| 2006/0061350 A1 | 3/2006 | Myers et al. | |
| 2007/0080676 A1 * | 4/2007 | Racz et al. | 324/117 H |
| 2007/0279053 A1 * | 12/2007 | Taylor et al. | 324/252 |
| 2008/0297138 A1 * | 12/2008 | Taylor et al. | 324/117 H |
| 2011/0227560 A1 * | 9/2011 | Haratani et al. | 324/117 R |
| 2011/0241665 A1 * | 10/2011 | Takatsuji | 324/253 |
| 2012/0203481 A1 * | 8/2012 | Carpenter et al. | 702/62 |

OTHER PUBLICATIONS

Dezuari, et al. "Printed circuit board integrated fluxgate sensor", Sensors and Actuators 81 (2000), pp. 200-203.

Tang, et al. "Excitation circuit for fluxgate sensor using saturable inductor", Sensors and Actuators A 113 (2004), pp. 156-165.

* cited by examiner

FIG. 18

APPARATUS AND METHOD FOR IN SITU CURRENT MEASUREMENT IN A CONDUCTOR

This application claims priority to and the benefit of U.S. Provisional Patent Application Ser. No. 61/760,820 that was filed on Feb. 5, 2013 and is entitled MULTI MAGNETIC SENSORS IN A PACKAGE FOR CURRENT MEASUREMENTS INSIDE THE CONDUCTOR, the entirety of which is incorporated by reference herein.

FIELD OF THE INVENTION

The present disclosure involves current measurement devices, and more particularly to methods and apparatus for measuring current using a sensor apparatus inside the conductor.

BACKGROUND

Current measurements are used in a variety of applications, such as closed loop feedback control of power distribution systems in which a controller operates according to measured currents flowing within a particular circuit. For instance, a switching power supply may be operated so as to regulate an output current, and a feedback loop is formed to provide the power supply controller with an estimate of the output current flowing to a load. Currents flowing through a conductor may be sensed by measuring the voltage across a sense resistor connected in series with the conductor, but this approach requires dissipation of energy through the sense resistor. To overcome this difficulty, magnetic sensor technology has been developed in which one or more sensors are placed near a current-carrying conductor to detect the magnetic field strength, and the amount of current flow is estimated based on the sensed field strength. In certain situations, however, the conductor is located in a machine or other system having significant amounts of magnetic fields unrelated to the current flowing through the conductor. In these conditions, a single magnetic sensor will detect fields associated with the current flow of interest as well as extraneous fields, sometimes referred to as crosstalk. Complicated filtering and signal conditioning circuits can be used to try to separate the signal interest from the crosstalk, but this increases the cost and complexity of the sensor system. Multiple sensor systems have been developed in which a number of magnetic sensors are disposed around the outside of the conductor, with the sensor signals being jointly processed to attempt to cancel the interference for improved current measurement accuracy. However, such multiple sensor techniques are much more costly than single sensor solutions, and occupy a significant amount of space in the area around the conductor of interest. In addition, the magnetic field strength near conductors carrying high amounts of current is often beyond the sensing range of high precision magnetic sensors, and accordingly high accuracy current sensing in these situations has been limited. Consequently, a need remains for improved apparatus and techniques by which cost effective accurate current sensing can be achieved in a compact sensor configuration while mitigating the adverse effects of crosstalk.

SUMMARY

The present disclosure provides in situ current measurement apparatus and techniques as well as conductor systems, in which a magnetometer is located inside the periphery of a conductor structure to measure current flowing through the conductor, by which the above-mentioned and other shortcomings of conventional current sensing techniques can be mitigated or avoided.

A conductor apparatus is provided in accordance with certain aspects of the present disclosure, including a conductive structure, such as a bus bar, solid or stranded wire, etc., in order to conduct current along a longitudinal direction, as well as a magnetometer with a magnetic sensor located at least partially within an outer periphery of the conductive structure, where the magnetic sensor has an associated sensing direction transverse to the longitudinal direction of the conductive structure. A sensor interface circuit is provided in the magnetometer to generate at least one output signal or value representing longitudinal current flow in the conductive structure based at least partially on a signal from the magnetic sensor. The magnetometer further includes a plurality of wires electrically connected to the sensor interface circuit and extending outside the outer periphery of the conductive structure. Placement of the magnetometer within the conductor facilitates use of higher sensitivity sensors such as fluxgate sensors, anisotropic magnetoresistive (AMR) sensors, gigantic magnetoresistive (GMR) sensors, a tunneling magnetoresistive or tunneling magnetoresistance (TMR) sensors, etc., due to lower magnetic field amplitude and potentially improved magnetic field uniformity within the outer periphery of the conductive structure. In addition, this magnetometer location technique advantageously reduces the amount of crosstalk sensed by the magnetometer, and occupies less space than the conventional approach of encircling the outside of the conductive structure with magnetic sensors.

In certain embodiments, the magnetometer includes two or more magnetic sensors located within the outer periphery of the conductive structure, with the individual sensors having an associated sensing direction transverse to the longitudinal direction of the conductive structure. The magnetic sensors are formed in a pattern to at least partially surround a point along the longitudinal direction within the outer periphery of the conductive structure.

In certain embodiments, moreover, the magnetometer includes a semiconductor structure or substrate with a first side transverse to the longitudinal direction, where the first side is positioned at least partially within the outer periphery of the conductive structure. The magnetic sensors are formed at least partially on or in the semiconductor structure in a pattern to at least partially surround a point along the first side of the substrate, and the sensor interface circuit in certain embodiments is formed on or in the semiconductor structure.

The magnetic sensors in certain embodiments are fluxgate sensors including a magnetically susceptible core structure as well as an excitation winding and at least one sense winding formed around the core structure. The sensor interface provides an AC excitation signal to the excitation winding of the individual magnetic sensors and generates at least one output signal or value based at least partially on an individual vector or vector sum of signals received from the sense windings of at least some of the individual one or more or all magnetic sensors.

The individual magnetic sensors in certain embodiments may comprise bridge circuits including at least four resistive elements, in which at least one of the resistive elements is an AMR or GMR sensor element, with the interface circuit providing excitation to the individual bridge circuits and generating the output signal or value at least partially according to a vector sum of signals received from sense terminals of at least some of the individual bridge circuits.

In certain embodiments, the magnetic sensors are formed in a pattern with sensing directions of at least two magnetic sensors being different and tangent to a circle surrounding a point along a first side of the magnetometer transverse to the longitudinal direction of the conductor. In various implementations, different multiple sensor patterns can be used, including without limitation parallel, triangular, rectangular, hexagonal, octagonal, T patterns, or circular patterns.

In certain embodiments, the magnetometer includes multiple groups of at least two magnetic sensors per group, with a first group spaced a first distance from a point along a first side of the magnetometer transverse to the longitudinal conductor direction, and the second group spaced a second distance from the point, where the sensor interface circuit generates a first output signal or value based at least partially on signals from the first group of magnetic sensors and generates a second output signal or value based at least partially on signals from the second sensor group.

In certain embodiments, a circular sensor can be made with a circular sensing direction. The coils of a circular fluxgate sensor or separate coils without any magnetic core can be used, such as a Rogowski coil with a circular sensing direction transverse to the longitudinal direction of the conductive structure, where the circular sensor surrounds a point along a first side of the magnetometer transverse to the longitudinal direction. Two or more such circular magnetic sensors of different diameters and/or different magnetometer sensor technology may be used in certain embodiments.

The magnetic sensor(s) in certain embodiments may be located in a recess or slot extending inward of a first side of the conductive structure, and the slot in certain embodiments may extend through to a second side of the conductive structure.

In accordance with further aspects of the disclosure, a conductor apparatus includes a conductive structure with at least one circular magnetic sensor located on an integrated circuit at least partially within the outer periphery of the conductive structure.

In accordance with further aspects of the disclosure, a method is provided for sensing current along a longitudinal direction of a conductive structure. The method includes positioning a magnetometer having a plurality of magnetic sensors within an outer periphery of the conductive structure such that sensing directions associated with the individual sensors are transverse to the longitudinal direction of the conductive structure, and such that the magnetic sensors form a pattern to at least partially surround a point along the longitudinal direction within the conductive structure periphery. The method further includes generating at least one output signal or value using a sensor interface circuit of the magnetometer to represent longitudinal current flow in the conductive structure at least partially according to an individual vector or vector sum of signals received from one or more or all magnetic sensors.

DESCRIPTION OF THE VIEWS OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

One or more embodiments or implementations are hereinafter described in conjunction with the drawings, wherein like reference numerals are used to refer to like elements throughout, and wherein the various features are not necessarily drawn to scale. The present disclosure provides techniques and apparatus for sensing current flow using a magnetic current sensing apparatus, referred to herein as a magnetometer, disposed at least partially within the outer periphery of a conductive structure. The disclosed concepts can be employed in connection with any type or form of conductive structure, including without limitation rectangular busbar conductors as shown in the figures, as well as an solid wires or cables, stranded wires or cables, etc., wherein the various aspects of the present disclosure are not limited by the illustrated examples.

Referring initially to FIGS. 1-5, FIG. 1 shows a conductor apparatus 100 with a conductive busbar structure 110 for conducting current along a longitudinal direction 102. For reference only, the various figures include arrows exemplary indicating X, Y, and Z coordinate axis. The longitudinal extent of the illustrated busbar 110 is generally straight (e.g., along the Z axis), although curved, serpentine, curvilinear or other longitudinal conductor structures 110 can be used. In the illustrated example, the busbar 110 includes first and second longitudinal ends 111 and 112, respectively, and has a generally rectangular shape with an outer periphery between the ends 111 and 112 which is defined by a top or first side 116, a bottom or second side 115, and laterally opposite sides 113 and 114. The busbar 110 includes a slot 118 extending inward of the top side 116, in which a magnetometer or current sensor apparatus 120 is positioned. In the illustrated example, the slot 118 is rectangular or circular or elliptical, and extends at least partially into the interior of the conductive structure 110. In various possible embodiments, moreover, the slot 118 may extend through the conductor 110, for example, including openings in both the top side 116 in the bottom side 115, although not a strict requirement of the present disclosure. In this regard, other forms of recesses 118 may be used by which a magnetometer or magnetic sensor element may be fully or at least partially located within the outer periphery of a conductive structure 110, and such recess may be formed by any suitable technique. In the illustrated example, for instance, the slot 118 may be machined into the top side 116 of the conductive structure 110, and may be sized to accommodate the magnetometer 120 including provision of egress for magnetometer wires 122 extending outwardly of the conductive structure outer periphery.

Figure 1:
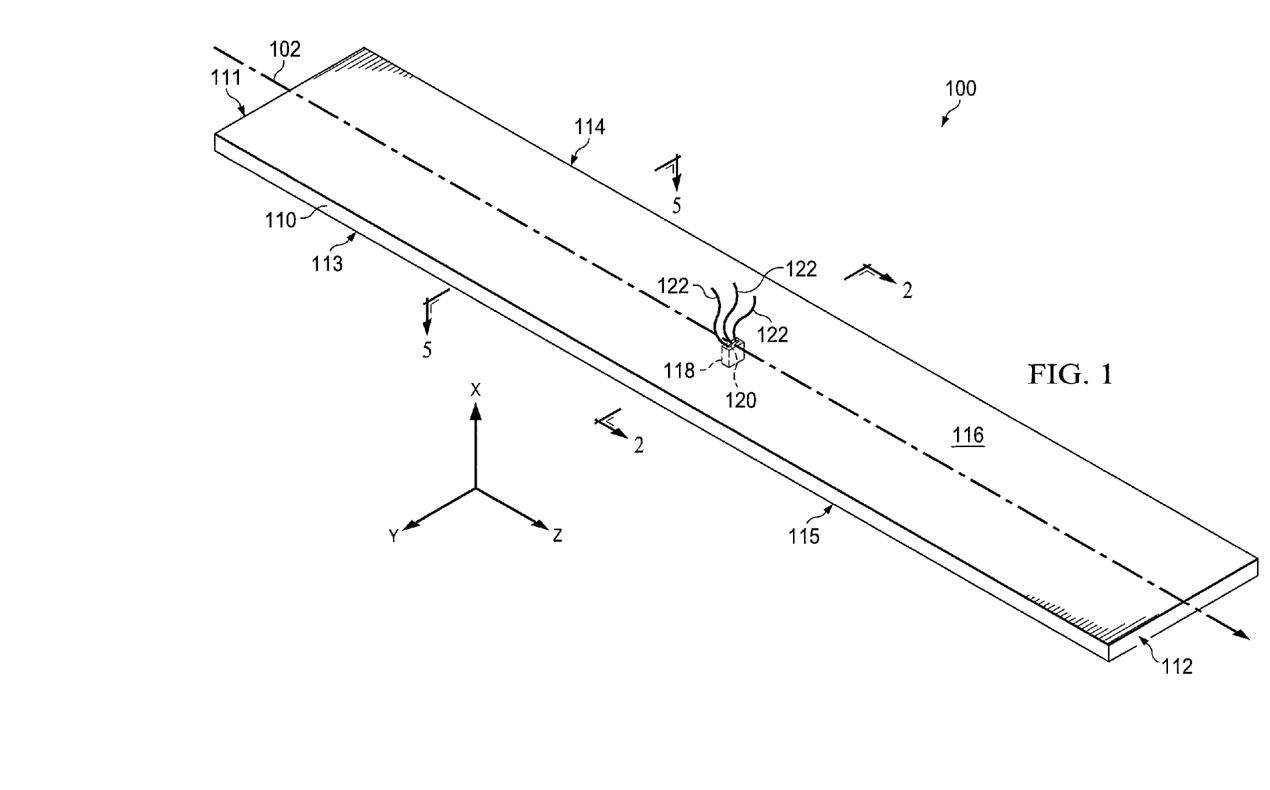
FIG. 1 is a perspective view illustrating an exemplary busbar conductive structure for conducting current along a longitudinal direction, with a magnetometer positioned within a slot extending into a first side of the busbar for sensing current flow in accordance with one or more aspects of the present disclosure.
Figure 2:
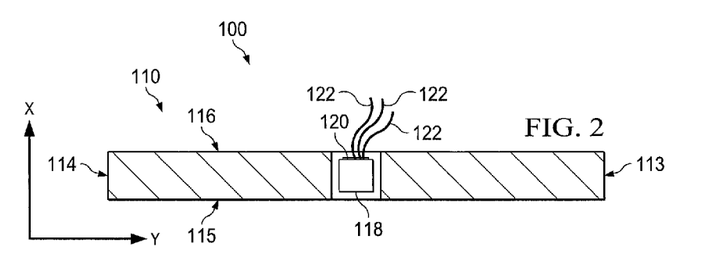
FIG. 2 is a sectional end elevation view taken along line 2-2 in FIG. 1 illustrating the magnetometer located in a vertical slot in the busbar.

As seen in FIG. 2, the magnetometer 120 is provided generally near the center of the vertical (X axis) extent and near the center of the lateral (Y axis) extent of the slot 118 and of the entire conductive structure 110, although not a strict requirement of the present disclosure. As previously mentioned, moreover, the recess 118 need not extend all the way through the conductive structure 110, and a recess 118 of any suitable location, shape and size can be used by which the magnetometer 120 is at least partially situated within the periphery of the conductive structure 110, and which provides external access to the output signal or value of the magnetometer 120 via two or more wires 122.

As discussed further below, the magnetometer 120 in various embodiments includes one or more magnetic sensors 124 positioned at least partially within the outer periphery of the conductive structure 110, such that an associated sensing direction of the sensor(s) is transverse to the longitudinal direction 102 of the conductive structure 110. In the various figures, the sensing direction of the sensors 124 are indicated using unidirectional arrows for simplicity of illustration, but it will be appreciated that fluxgate sensors, AMR sensors, GMR sensors, TMR sensors, and other magnetic sensors may be bidirectional with the capability of sensing magnetic fields in both directions (e.g., both polarities) along the indicated direction. In this regard, locating the sensor 124 in this orientation allows detection and sensing of the amplitude of the magnetic field resulting from longitudinal current flow in the conductive structure 110, where the sensing direction of the individual sensors 124 is preferably orthogonal or perpendicular to the longitudinal direction 102, although any transverse orientation is sufficient to sense magnetic field strength. In other words, the magnetic sensors 124 are placed such that the sensing direction of the individual magnetic sensors 124 is not parallel to the longitudinal direction 102 along which current flows in the conductive structure 110. In this manner, the sensor or sensors 124 of the magnetometer 120 can detect the magnetic field within the periphery of the conductive structure 110 and the magnetometer 120 can provide one or more output signals or values via wires 122 to represent the current flowing through the conductive structure 120.

Figure 3:
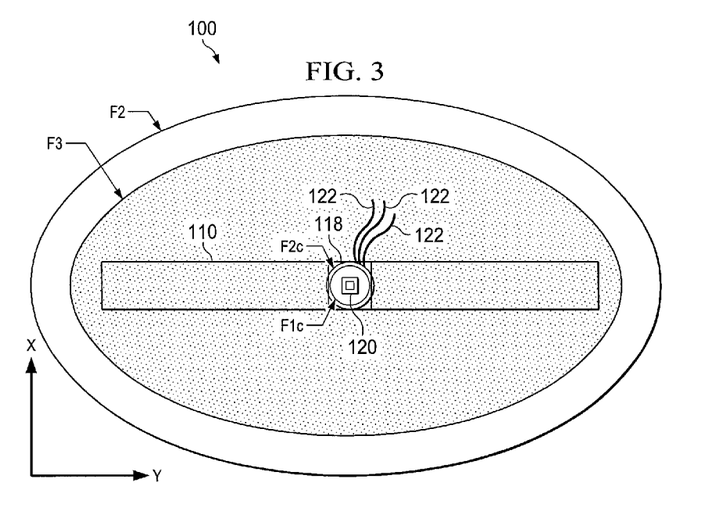
FIG. 3 is an end elevation view showing simulated magnetic field strength contours in and around the slot and magnetometer in the conductive busbar structure of FIGS. 1 and 2.

Referring also to FIG. 3, and without wishing to be tied to any particular theory, the provision of the recess 118 and the shape of the conductive structure 110 are believed to result in a magnetic field inside of the conductive structure 110 which is smaller and more uniform than is the field around the outside of the structure 110. FIG. 3 illustrates simplified magnetic field contours simulated for a longitudinal rectangular busbar structure 110, in which three exemplary field strength regions F1, F2 and F3 are illustrated having progressively higher magnetic field strength resulting from conduction of electrical current along the longitudinal direction 102 (out of the page with respect to FIG. 3). As an example, for a copper busbar having a lateral width (Y direction) of approximately 65 mm and a vertical height (X direction) of approximately 10 mm connecting a current of 2000 A DC, the field indicated as F3 in FIG. 3 at and immediately outward of the busbar periphery is approximately 9-10 mTesla, and is lower (e.g., approximately 7-9 mTesla) in the region F2 outside of the region F3, with further reduction in the field strength as the distance from the conductive structure 110 increases.

However, within the peripheral extent of the conductive structure 110, lower field strength regions exist, including region F2c of approximately 7-9 mTesla (corresponding to a 2000 A current flow in the busbar conductor structure 110, wherein different field strength values would be found for different currents). In the illustrated example, still lower field strengths below 7 mTesla are found in the region F1c proximate the center slot 118. In particular, it is believed that the magnetic field strength at this internal region F1c is significantly lower than those immediately outlying the outer periphery of the conductive structure 110, and is of considerable uniformity. Consequently, it is believed that location of the magnetometer 120 within this region F1c provides significant advantages compared with conventional techniques in which magnetic sensors were located around the outside of the conductor 110. For instance, the lower field strength in the regions F1 facilitates employment of high sensitivity magnetic field sensors 124 by which improved current measurement accuracy can be achieved without saturating the sensors 124. Furthermore, positioning the sensors 124 in the interior of the conductor periphery minimizes or reduces adverse effects of crosstalk associated with other sources of magnetic fields near the conductive structure 110. As seen in FIG. 3, moreover, for a symmetrical structure such as the illustrated busbar 110, the recess 118 is advantageously provided near the lateral center of the structure 110, although not a strict requirement of the present disclosure. For instance, the recess 118 and magnetometer 120 can advantageously be located laterally outward of the center (e.g., to the left or right of the region F1c in FIG. 3) for operation to sense magnetic fields corresponding to current flow in the conductive structure 110 using sensors that might otherwise saturate if placed in the higher field strength region F3 on the outside of the conductor periphery.

Further in this regard, is believed that the shape and geometry of the conductive structure 110, as well as that of the recess 118 can be used to shape the magnetic field profile within the periphery of the conductive structure 110. Thus, for instance, different recess shapes and sizes or multiple recesses may be used to tailor the magnetic field strength and/or uniformity for the location in which the magnetometer 120 is to be positioned within the busbar 110. In this regard, the illustrated generally rectangular slot type recess 118 at the center is believed to provide a generally circular interior region F1c at and near the centroid of the conductive structure 110. In this regard, different embodiments of the conductor apparatus 100 may include multiple recesses 118 and corresponding magnetometers 120, for example, an integer number magnetometers 120 situated in corresponding recesses. For a given design, moreover, the location and geometry of recesses or slots 118 in the conductive structure 110 can be designed in consideration of any corresponding thermal and other effects on the current density in neighboring portions of the conductive material 110.

Figure 4:
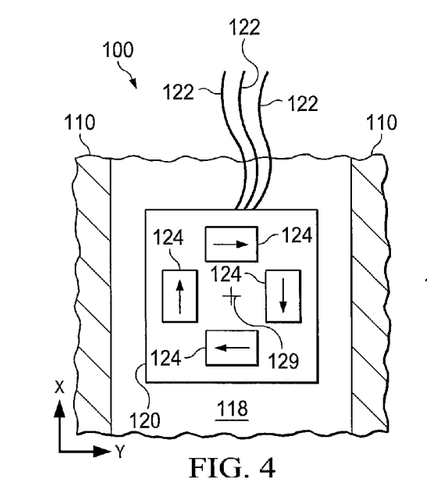
FIG. 4 is a partial sectional end elevation view showing further details of the positioning of the magnetometer in the slot of the conductive busbar structure.
Figure 5:
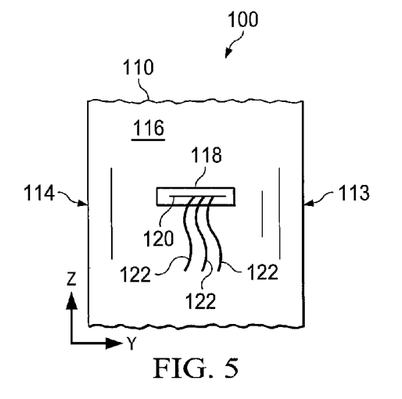
FIG. 5 is a partial top plan view taken along line 5-5 of FIG. 1 showing the magnetometer positioned within the slot in the top side of the conductive busbar structure.

As seen in FIGS. 4 and 5, the magnetometer 120 in certain embodiments is a relatively small integrated circuit-based structure having one or more magnetic sensors 124 and wiring 122 for providing power to the magnetometer 120 as well as for providing configuration settings and output signals to external devices (not shown). In one possible example, an integrated circuit magnetometer 120 can be fabricated to a relatively small size of approximately 2 mm square×0.3 mm thick for location within a correspondingly small slot or recess 118, whereby the creation of a slot or other recess 118 need not be a significant departure from the overall current carrying capability of the conductive structure 110. In this respect, the indication in FIG. 4 of the relative sizes of the slot 118 and the magnetometer 120 are not necessarily drawn to scale, wherein certain embodiments are possible in which the lateral (Y direction) extent of the slot 118 generally corresponds to that of the magnetometer 120, and the same may be true of the vertical (X direction) extents of the slot 118 and the magnetometer 120. Moreover, multiple magnetometers 120 may be positioned within a given recess or slot 118, for example, to provide redundant sensors in case one magnetometer 120 becomes inoperable.

In addition, while the simple example of a machined slot 118 is illustrated and described, other forms of recesses are possible, and embodiments are contemplated in which a magnetometer 120 is at least partially embedded within the conductive structure 110 by any suitable fabrication techniques. For instance, upon installation of the magnetometer 120 within the machined slot 118 in the illustrated examples, one or more types of filler materials may be introduced into the recess 118, for example, to effectively encapsulate the magnetometer 120 while leaving parts of the wiring 122 extending outward of the conductive structure 110, where such filler material may in certain embodiments be designed to be electrically isolating and/or thermally conductive to facilitate removal of heat from the area around the magnetometer 120.

Figure 6:
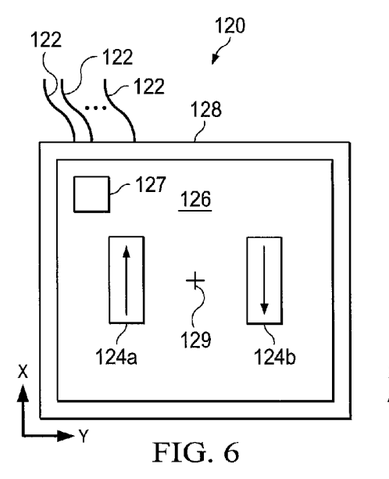
FIG. 6 is a simplified end elevation view of an integrated circuit magnetometer embodiment with two magnetic sensors formed in a parallel pattern on opposite sides of a point on a semiconductor substrate.
Figure 7:
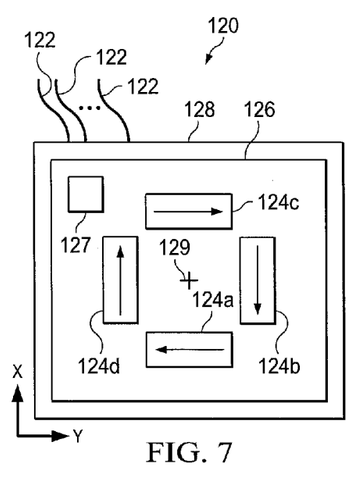
FIG. 7 is a simplified end elevation view of an integrated circuit magnetometer embodiment with four magnetic sensors formed in a rectangular pattern encircling a point on a semiconductor substrate.

Referring now to FIGS. 6-16, various illustrative embodiments of the current sensor apparatus (magnetometer) 120 are shown, including various integrated circuit implementations in which one or more magnetic sensors 124 are formed at least partially on or in a single semiconductor substrate 126 (e.g., silicon) in a pattern to at least partially surround a point 129 along a first side of the substrate 126. In this regard, the illustrated magnetometers 120 may be installed within a slot or recess 118 of the illustrated conductive structures 110 such that the point 129 on the substrate 126 is located along the longitudinal direction 102 within the outer periphery of the conductive structure 110 into which the magnetometer 120 is installed, as seen in FIG. 4 above. In this manner, the pattern of magnetic sensors 124 generally surround or encompass a point along the longitudinal direction 102 that which current is to be sensed, with a first side or face of the magnetometer 120 preferably being generally normal to the longitudinal direction 102, although transverse orientations other than strictly normal or perpendicular may be used. As shown in FIG. 6, for example, two substantially similar magnetic sensors 124a and 124b are formed on or in a semiconductor substrate 126 in a parallel pattern substantially equidistant from and on opposite sides of the center point 129. In the example of FIG. 7, four substantially similar magnetic sensors 124a, 124b, 124c and 124d are formed on or in the substrate 126 in a generally rectangular pattern with each sensor 124 being substantially equidistant from the center point 129. Any suitable substrate 126 can be used in constructing the integrated circuit-based magnetometer 120, where the magnetometer 120 may further include one or more integrated circuit packaging structures 128, such as a printed circuit board, encapsulated packaging with externally accessible electrical connections, etc., including suitable electrical connection via external wiring 122 to a sensor interface circuit 127.

In practice, any suitable type or form of magnetic sensors 124 can be used, including without limitation fluxgate sensors, AMR sensor elements, GMR sensor elements, TMR sensor elements, Rogowski coil structures or other circular magnetic sensors (e.g., AMR, CGM, TMR), etc., by which magnetic fields can be sensed to generate one or more output signals or values via the circuitry 127 representing current flow within the conductive structure 110. Any suitable interface circuitry 127 can be used which generates one or more output signals or values based at least partially on signals from the magnetic sensor(s) 124. In this regard, the circuitry 127 in certain embodiments provides an analog signal representing an individual vector or vector sum of the signals from at least one of the sensors 124. In other possible implementations, the circuit 127 may include analog to digital conversion circuits, and may optionally include further logic including programmable or programmed processing elements, in order to provide a digital value representing an individual vector or vector sum of the signal(s) from the sensors 124, and thus indicative of sensed current flowing through the conductive structure 110.

As seen in the examples of FIGS. 6 and 7, moreover, each of the magnetic sensors 124 has an associated sensing direction (indicated by arrows in the figures), meaning that the sensor 124 is able to sense or detect magnetic field amplitude or strength along the indicated sensing direction. In addition, the generally rectangular pattern of the sensors 124 in the example of FIG. 7 is created such that the sensing directions of the sensors 124 are oriented so as to generally encircle the pattern center point 129, with the sensing directions being in a generally circular orientation as seen in the figures. Moreover, the configurations of FIGS. 6 and 7 orient the sensing directions of the sensors 124 to each be substantially tangent to a circle surrounding the center point 129 along the illustrated (e.g., first) side of the semiconductor substrate 126. In this manner, the sensor interface circuitry 127 in certain embodiments generates at least one output signal or value based at least partially on signals from the magnetic sensors 124a-124d, and can advantageously sum the corresponding sensor signals such that crosstalk can be mitigated or avoided in generation of the output signal or value. In this respect, placing the magnetic sensors 124 around the point 129 in this fashion, and a summation (e.g., vector sum) of the signals from the sensors 124 in the encircling pattern advantageously operates to cancel interference, thereby improving current measurement accuracy. In addition, as mentioned above, the placement of the magnetometer 120 within the periphery of the conductive structure 110 further improves on this concept by effectively isolating the magnetometer 120 from at least some of the magnetic fields generated by external disturbance sources.

Figure 8:
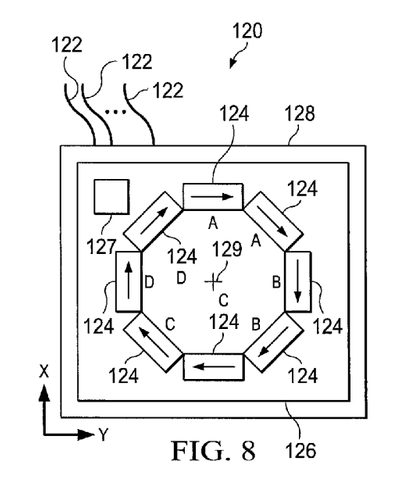
FIG. 8 is a simplified end elevation view illustrating another integrated circuit magnetometer embodiment with eight magnetic sensors formed in an octagonal pattern surrounding the point on a semiconductor substrate.

FIG. 8 illustrates another exemplary pattern, in this case, an octagonal pattern of 8 magnetic sensors 124, with the sensing directions of the sensors 124 being generally tangent to a circle surrounding the point 129. In this embodiment, like that of FIGS. 6 and 7, the sensor interface circuit 127 in certain embodiments can generate at least one output signal or value based at least partially on an individual vector or vector sum of signals received from the individual sensors 124.

Figure 9:
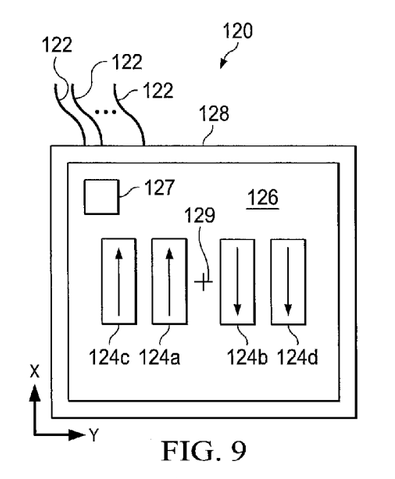
FIGS. 9 and 10 are simplified end elevation views illustrating further integrated circuit magnetometer embodiments having first and second sets of two magnetic sensors spaced at different distances from a sensing point on the top side of the semiconductor substrate.

FIG. 9 illustrates another integrated circuit-based magnetometer example, in which a first pair of magnetic sensors 124a and 124b are positioned respectively to the left and right of the point 129, and a second pair of magnetic sensors 124c and 124d are disposed laterally outward of the first pair. In this configuration, the inner pair 124a and 124b are a first distance from the point 129, and the second pair 124e and 124d are a second (longer) distance from the point 129. As a result, assuming otherwise generally similar construction of the individual sensors 124, the interface circuitry 127 can be constructed such that the magnetometer 120 can provide dual range operation by generating a first output signal or value based at least partially on the signals from the first pair of sensors 124a, 124b and by generating a second output signal or value based at least partially on signals from the other pair 124c, 124d. An external device receiving these output signals or values can thus selectively use one or the other based upon an expected range of current amperage flowing through the bus bar 110, with the first pair 124a, 124b being used for a first (higher) range, and the second pair 124c, 124d being used for a second (lower) current range. In general, such multiple groupings of sensors, the placement thereof, and the geometry thereof, can be designed for different current ranges, thereby providing multiple range measurement capabilities via a single magnetometer 120. In this case, moreover, the sensing directions of the individual sensors 124 are each tangent to a circle surrounding the point 129, and the summation of the signals within each of the sensor pairs provides cancellation or mitigation of extraneous crosstalk for whichever sensor range is being used.

Figure 10:
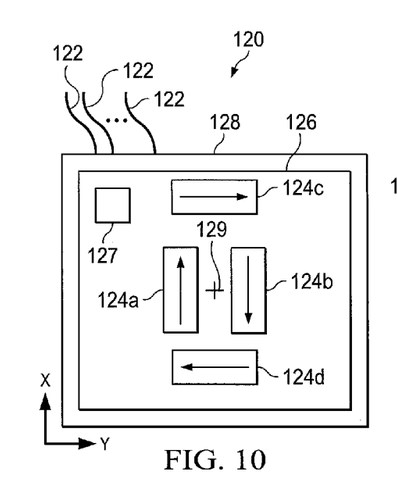

FIG. 10 illustrates another example of this concept, in which the first pair of magnetic sensors 124a and 124b are configured to the left and right of the point 129, whereas the second pair in this example includes a sensor 124c positioned above the point 129, as well as a sensor 124d positioned below the point 129, where the first pair is spaced a first distance from the point 129, and the second pair is spaced a second (larger) distance from the point 129.

Figure 11:
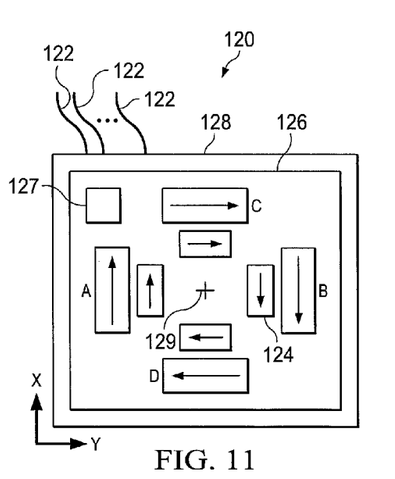
FIG. 11 is a simplified end elevation view showing a dual range magnetometer embodiment having first and second sets of magnetic sensors in corresponding rectangular patterns.

FIG. 11 illustrates yet another example of a dual-range magnetometer 120, in which a first group of relatively small magnetic sensors 124 is positioned in a rectangular pattern encircling the center point 129, and a second group of four somewhat larger magnetic sensors 124 is likewise configured in a rectangular pattern which surrounds the inner rectangular pattern. In this example, dual range sensing can be accomplished using the inner group of four relatively small sensors 124 for large currents, and dual axis sensing of smaller currents can be accomplished using the outer group, with the interface circuitry 124 providing corresponding output signals or values based on individual vectors or vector sums of the corresponding signals within the group.

Figure 12:
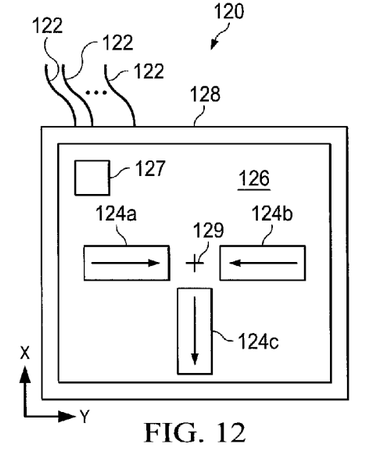
FIG. 12 is a simplified end elevation view illustrating an integrated circuit magnetometer using three magnetic sensors positioned in a T pattern.
Figure 13:
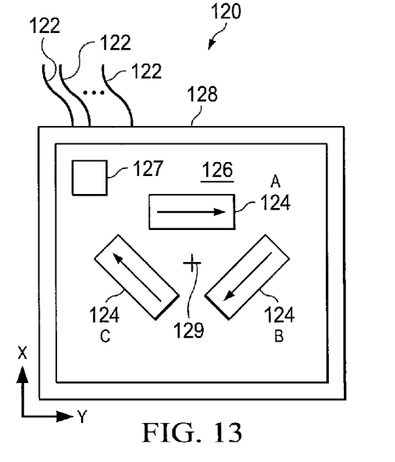
FIG. 13 is a simplified end elevation view illustrating an integrated circuit magnetometer using three magnetic sensors positioned in a triangular pattern.
Figure 14:
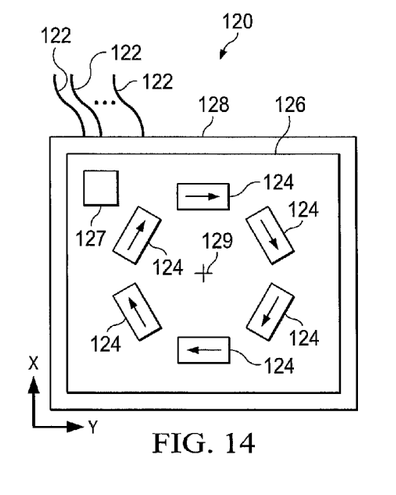
FIG. 14 is a simplified end elevation view showing an integrated circuit magnetometer with six magnetic sensors formed in a hexagonal pattern.

FIGS. 12-14 respectively illustrate "T", triangular, and hexagonal patterns of magnetic sensors 124 in which the magnetometer 120 includes at least three magnetic sensors 124 located within the outer periphery of the conductive structure 110 when installed in the recess 118. The T pattern example of FIG. 12 includes laterally oriented upper sensors 124a and 124b and a vertically oriented lower sensor 124c. In the example of FIG. 13, three magnetic sensors 124 are positioned at substantially equal distances from the center point 129 and are angularly spaced by approximately 120° from one another to form a triangular pattern, with the circuit 127 providing the output signal or value based on an individual vector or vector sum of the sensor signals. In FIG. 14, six sensors 124 are positioned in a generally hexagonal pattern around the center point 129, with the interface circuitry 127 providing the output signal or value according to an individual vector or vector sum of the signals from the six sensors 124.

Figure 15:
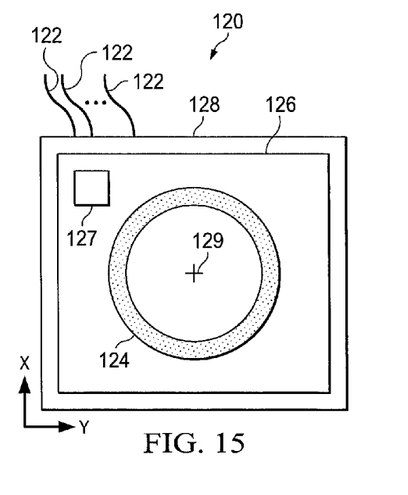
FIGS. 15 and 16 are simplified end elevation views illustrating integrated circuit magnetometer embodiments using one or more Fluxgate or AMR/GMR/TMR or Hall or Rogowski coil circular magnetic sensors.
Figure 16:
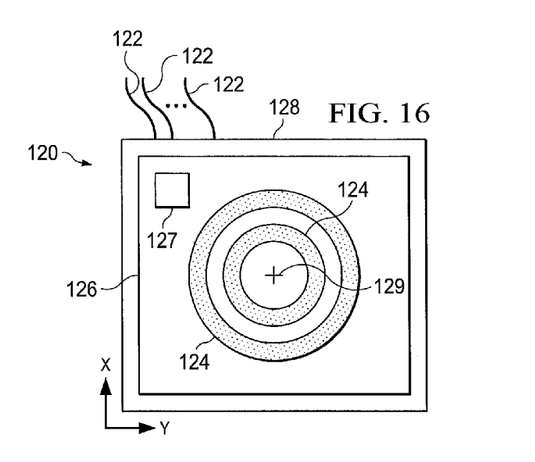

FIGS. 15 and 16 illustrate further exemplary integrated circuit-based magnetometers 120 in which one or more circular sensors 124 are used. In this regard, the sensors 124 may be any suitable magnetic sensor having a generally circular sensing direction extending at least partially around the center point 129. The circular magnetic sensors 124 may include at least one Rogowski coil, circular fluxgate sensor, circular anisotropic magnetoresistive (AMR) sensor, circular gigantic magnetoresistive (GMR) sensor, a tunneling magnetoresistive (TMR) sensor, or circular Hall sensor in certain embodiments. In this regard, a Rogowski coil structure 124 can be provided on and/or in a semiconductor substrate 126 by successively providing toroidal windings encircling a magnetic core structure formed on and/or in the substrate 126, for example, with initial turns on a first or upper side of the substrate, and return windings on a second or lower side of the substrate 126. In these examples, the interface circuitry 127 may include any suitable circuitry for providing an output signal representing the current flowing through the conductive structure 120, for example, with electrical connection of the toroidal windings being provided to an integrated circuit (not shown) to generate a voltage output signal (or a digital value) indicative of the current flowing through the conductive structure 110 when the magnetometer 120 is installed in the recess 118 as described above. In the embodiment of FIG. 13, a single circular sensor structure 124 is provided, whereas the example of FIG. 16 includes first and second circular sensors 124, each encircling the center point 129, with different diameters and/or different magnetometer sensor technology. This embodiment may be used, for example, with corresponding dual range interface circuitry 127 such that a first signal or value is provided based on the output of the first sensor 124, and a second signal or value is provided based on the output of the second sensor 124.

Figure 17:
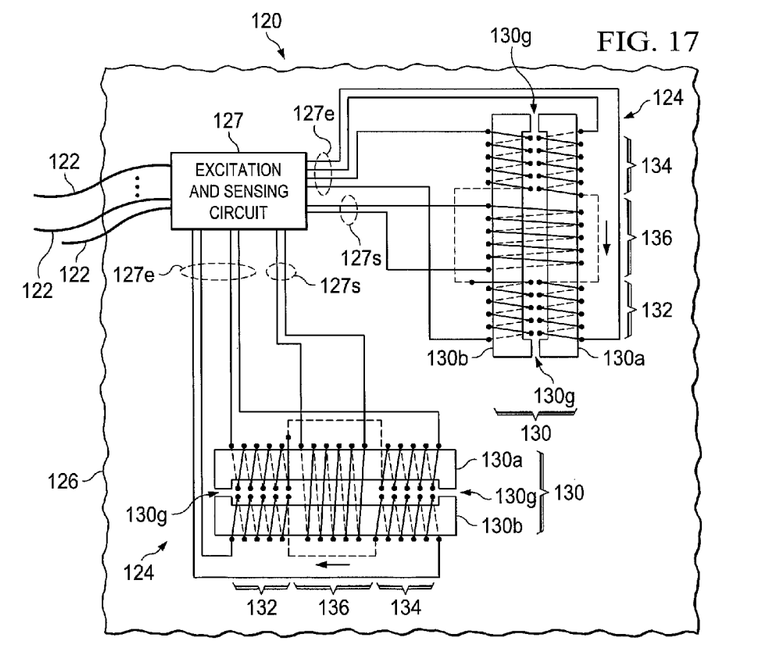
FIG. 17 is a partial end elevation view schematically illustrating two exemplary fluxgate magnetic sensors formed on or in a semiconductor substrate of an integrated circuit and associated excitation and sensing interface circuitry of a magnetometer.

FIG. 17 illustrates a portion of an exemplary magnetometer structure 120 in which fluxgate magnetic sensors 124 are used, wherein only two exemplary sensors are shown. As seen, the individual fluxgate sensors 124 include a magnetically susceptible core structure 130, such as may be formed on and/or in a semiconductor substrate 126, along with a pair of excitation windings 132 and 134 and a centrally located sense winding 136, where the windings 132, 134 and 136 are formed around a corresponding portions of the core structure 130. Any number of sense windings and excitation windings may be used in different embodiments. In this example, moreover, the magnetically susceptible core structure 130 includes two longitudinally opposite gaps 130g separating bilaterally symmetrical core portions 130a and 130b. Other designs are possible in which no gap 130g is used, or a single gap may be provided, or more than two such gaps 130g may be included in the core structure 130.

In operation, the excitation circuit 127 provides an AC excitation signal 127e to the excitation windings 132 and 134 associated with each of the sensors 124, and the sensing circuitry 127 provides at least one output signal or value based at least partially on a vector sum of sensor signals 127s received from the sense winding 136 of all or at least some of the individual magnetic sensors 124. As AC excitation current is provided to the excitation windings 132 and 134, the core structure 130 is alternatively driven through magnetic saturation and demagnetization, thereby inducing an electrical current flow in the sensing coil 136. When the core structure 130 is exposed to a magnetic field, such as caused by current flow within the bus bar conductive structure 110 (FIG. 1), the core structure 130 is more easily saturated in alignment with that field, and less easily saturated in opposition to it. As a result, the induced sense coil current will be out of phase with the excitation current, and the difference will be related to the strength of the external magnetic field. In one possible implementation, the excitation and sensing (interface) circuit 127 includes an integrator circuit providing an analog output voltage proportional to the sensed magnetic field along the corresponding sensing direction of a given fluxgate magnetic sensor 124. In addition, the circuitry 127 may include analog and/or digital processing components (not shown) to generate at least one output signal or value based at least partially on a vector sum of the integrals of the signals 127s received from the sense windings 136.

Figure 18:
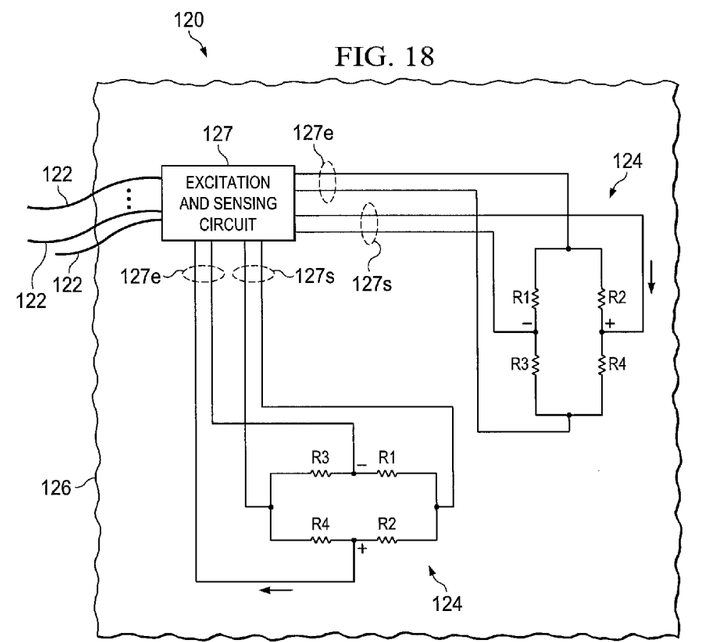
FIG. 18 is a partial end elevation view schematically illustrating two AMR or GMR-based bridge circuit magnetic sensors coupled with excitation and sensing circuitry of a magnetometer in accordance with the present disclosure.

Referring now to FIG. 18, the magnetic sensors 124 in certain embodiments may comprise bridge circuits having at least four resistive elements, where at least one of the resistive elements is an anisotropic magnetoresistive (AMR) sensor or a gigantic magnetoresistive (GMR) sensor or a tunneling magnetoresistive (TMR) sensor. As seen in FIG. 18, for example, each of the illustrated sensors 124 includes a bridge circuit with resistive elements R1, R2, R3 and R4, at least one of which is an AMR or GMR element or sensor. AMR elements can be made, for example, by deposition of a permalloy (e.g., nickel-iron) thin film on a semiconductor substrate 126, and patterning thereof into a resistive strip as shown. In practice, the electrical resistance of such an AMR element changes by a certain percentage based on the presence of a magnetic field in the indicated sensing direction, and one or more of these AMR resistor elements may be connected in a Wheatstone bridge to measure the magnitude of the magnetic field along the sensing direction. GMR type sensor elements may be constructed on and/or in the semiconductor substrate 126 by formation of upper and lower ferromagnetic alloy layers, (such as PZT, etc.) above and below an ultrathin non-magnetic nonmagnetic conducting metal layer (e.g., copper), with electrical connections to two longitudinally opposite ends of the sandwich structure (not shown). One or more of these elements can be connected in a bridge circuit as shown in FIG. 18 to form a sensor 124 with a corresponding sensing direction. As with the AMR embodiments, the excitation and sensing circuitry 127 in certain embodiments provides one or more excitation signals 127e to the resulting bridge circuit of the individual magnetic sensors 124, and generates at least one output signal or value based at least partially on an individual vector or vector sum of signals 127s received from sense terminals of the individual one or more or all bridge circuits.

The present disclosure thus provides a variety of magnetometer configurations and constructions by which one or more magnetic sensors 124 can be embedded or otherwise placed within the outer periphery of an electrically conductive structure 110 for sensing current flow therein. These concepts advantageously minimize the amount of physical space occupied by the sensing apparatus, and also reduce or avoid adverse effects of crosstalk in sensing current flow due to placement of the magnetic sensors 124 within the periphery of the conductive structure and by forming the sensors 124 in a pattern at least partially surrounding a point along the longitudinal direction 102 of the conductive structure 110.

The disclosure also contemplates methods and apparatus for sensing current along a longitudinal direction 102 of a conductive structure 110, including location or positioning of a magnetometer 120 comprising a plurality of magnetic sensors 124 within an outer periphery of the conductive structure 110 such that the sensing directions of individual magnetic sensors 124 are transverse to the longitudinal direction 102 and such that the sensors 124 form a pattern to at least partially surround a point 129 along the longitudinal direction 102. In addition, the sensing methods include generating at least one output signal or value representing longitudinal current flow in the conductive structure 110 at least partially according to an individual vector or vector sum of signals 127s received from the magnetic sensors 124 using a sensor interface circuit 127 of the magnetometer 120.

In addition, the present disclosure contemplates novel current sensor apparatus 120 as shown above, including a semiconductor substrate 126 with at least two magnetic sensors 124 formed to have an associated sensing direction generally parallel with a first side of the semiconductor substrate 126. The magnetic sensors 124 are formed at least partially on or in the substrate 126 in a pattern to at least partially surround a point 129 along the first side of the semiconductor substrate 126. The sensor apparatus 120 further includes a sensor interface circuit 127 also formed on or in the substrate 126 to generate one or more output signals or values based at least partially on signals from the magnetic sensors 124, as well as a plurality of wires 122 electrically connected to the sensor interface circuitry 127. As noted above, relatively small current sensing apparatus or magnetometers 120 can be created using fluxgate sensors 124, AMR or GMR sensor elements in a bridge circuit, or even a single or multiple circular sensors such as Rogowski coils 124 formed on or in an integrated circuit substrate 126 with corresponding interface circuitry 127 and wiring 122 to provide a relatively small structure. These devices 120, moreover, can be easily inserted into a slot or other recess of a conductive structure 110 for high resolution and accuracy in measuring current flowing through the structure 110 while minimizing the amount of physical space taken up by the sensing apparatus and reducing or avoiding adverse effects of crosstalk.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:

1. A conductor apparatus, comprising:
a conductive structure operative to conduct current along a longitudinal direction, the conductive structure comprising an outer periphery extending between first and second longitudinal ends; and
a magnetometer, comprising:
an array of at least two magnetic sensors located on a single integrated circuit at least partially within the outer periphery of the conductive structure, the array of at least two magnetic sensors including:
first and second circular magnetic sensors, the first and second circular sensors individually having an associated circular sensing direction transverse to the longitudinal direction of the conductive structure and individually surrounding the point along the first side of the magnetometer, wherein the first and second circular sensors are concentric of different diameters,
a sensor interface circuit operatively coupled to the magnetic sensors to generate at least one output signal or value representing longitudinal current flow in the conductive structure based at least partially on at least one signal from the magnetic sensors, and
a plurality of wires electrically connected to the sensor interface circuit and extending outside the outer periphery of the conductive structure.

2. The conductor apparatus of claim 1, wherein the magnetometer comprises at least three magnetic sensors located within the outer periphery of the conductive structure, the magnetic sensors individually having an associated sensing direction transverse to the longitudinal direction, the magnetic sensors formed in a pattern to at least partially surround a point along the longitudinal direction within the outer periphery of the conductive structure.

3. The conductor apparatus of claim 2:
wherein the magnetometer comprises multiple groups of at least two magnetic sensors per group;
wherein the magnetic sensors of a first group are spaced a first distance from a point along a first side of the magnetometer transverse to the longitudinal direction;
wherein the magnetic sensors of a second group are spaced a second distance from the point along a first side of the magnetometer; and
wherein the sensor interface circuit is operative to generate a first output signal or value based at least partially on signals from the first group of magnetic sensors and to generate a second output signal or value based at least partially on signals from the second group of magnetic sensors.

4. The conductor apparatus of claim 1:
wherein the magnetometer comprises a semiconductor substrate with a first side transverse to the longitudinal direction and positioned at least partially within the outer periphery of the conductive structure;
wherein the magnetic sensors are formed at least partially on or in the semiconductor substrate in a pattern to at least partially surround a point along the first side the semiconductor substrate; and
wherein the sensor interface circuit is formed at least partially on or in the semiconductor substrate.

5. The conductor apparatus of claim 1:
wherein the magnetic sensors are fluxgate sensors;
wherein the individual fluxgate sensors comprise:
a magnetically susceptible core structure,
an excitation winding formed around a first portion of the core structure, and
at least one sense winding formed around the second portion of the core structure; and
wherein the sensor interface circuit provides an AC excitation signal to the excitation winding of one or more of the individual magnetic sensors, and generates the at least one output signal or value based at least partially on an individual vector or vector sum of signals received from the sense windings of at least some of the individual magnetic sensors.

6. The conductor apparatus of claim 1:
wherein the individual magnetic sensors comprise bridge circuits including at least four resistive elements, with at least one of the resistive elements being an anisotropic magnetoresistive (AMR) sensor or a gigantic magnetoresistive (GMR) sensor; and
wherein the sensor interface circuit provides at least one excitation signal to the bridge circuits of the individual magnetic sensors, and generates the at least one output signal or value based at least partially on an individual vector or vector sum of signals received from sense terminals of at least some of one or more of the individual bridge circuits.

7. The conductor apparatus of claim 1, wherein the magnetic sensors are formed in the pattern such that the sensing directions of at least two magnetic sensors are different, and the sensing directions of the at least two magnetic sensors are tangent to a circle surrounding a point along a first side of the magnetometer transverse to the longitudinal direction.

8. The conductor apparatus of claim 2, wherein the pattern formed by the magnetic sensors is at least one of a parallel pattern, a triangular pattern, a rectangular pattern, a hexagonal pattern, an octagonal pattern, a T pattern or a circular pattern.

9. The conductor apparatus of claim 1, wherein the circular magnetic sensors individually include at least one Rogowski coil, circular fluxgate sensor, circular anisotropic magnetoresistive (AMR) sensor, circular gigantic magnetoresistive (GMR) sensor, or circular Hall sensor.

10. The conductor apparatus of claim 1, wherein the conductive structure includes a first side along a portion of the outer periphery of the conductive structure, with a recess extending inward of the first side at least partially toward a second side, and wherein the magnetic sensors are located at least partially within the recess.

11. The conductor apparatus of claim 1, wherein the conductive structure is a bus bar.

12. The conductor apparatus of claim 1, wherein the magnetic sensors include at least one of a tunneling magnetoresistive (TMR) sensor, an anisotropic magnetoresistive (AMR) sensor, and a gigantic magnetoresistive (GMR) sensor.

13. A conductor apparatus, comprising:
a conductive structure operative to conduct current along a longitudinal direction, the conductive structure comprising an outer periphery extending between first and second longitudinal ends; and
a magnetometer, comprising:
first and second circular magnetic sensors located on an integrated circuit at least partially within the outer periphery of the conductive structure, the first and second circular sensors individually having an associated circular sensing direction transverse to the longitudinal direction of the conductive structure and individually surrounding a point along the first side of the magnetometer, wherein the first and second circular sensors are concentric of different diameters, a sensor interface circuit operatively coupled to the magnetic sensor to generate at least one output signal or value representing longitudinal current flow in the conductive structure based at least partially on at least one signal from the magnetic sensor, and a plurality of wires electrically connected to the sensor interface circuit and extending outside the outer periphery of the conductive structure.

14. The conductor apparatus of claim 13, wherein the circular magnetic sensors individually include at least one Rogowski coil, circular fluxgate sensor, circular anisotropic magnetoresistive (AMR) sensor, circular gigantic magnetoresistive (GMR) sensor, circular tunneling magnetoresistive (TMR) sensor, or circular Hall sensor.

15. The conductor apparatus of claim 13, wherein the at least one circular magnetic sensor is a Rogowski coil, a circular fluxgate sensor, a circular anisotropic magnetoresistive (AMR) sensor, a circular gigantic magnetoresistive (GMR) sensor, or a circular Hall sensor.

16. The conductor apparatus of claim 13, wherein the conductive structure is a bus bar.

* * * * *